United States Patent [19]

Saitōh

[11] Patent Number: 4,587,640

[45] Date of Patent: May 6, 1986

[54] CASSETTE TYPE SEMICONDUCTOR MEMORY DEVICE

[75] Inventor: Yuichi Saitōh, Tokyo, Japan

[73] Assignee: Tokyo Shibaura Denki Kabushiki Kaisha, Kawasaki, Japan

[21] Appl. No.: 550,209

[22] Filed: Nov. 9, 1983

[30] Foreign Application Priority Data

Nov. 12, 1982 [JP] Japan .............................. 57-197713

[51] Int. Cl.⁴ ............................................ G11C 13/00
[52] U.S. Cl. .................................. 365/229; 365/226; 371/66
[58] Field of Search .................... 365/229, 226; 371/8, 371/66

[56] References Cited

U.S. PATENT DOCUMENTS 4,388,706  6/1983  Butler ................................. 365/229

Primary Examiner—Terrell W. Fears
Attorney, Agent, or Firm—Cushman, Darby and Cushman

[57] ABSTRACT

A cassette type semiconductor memory device is provided with a RAM and a back-up battery within a cassette, with a connector connected to the main frame of a data processor. The RAM and its periphery circuit, as well, are backed up by the battery. The live-line insertion/removal of the memory pack is detected by monitoring the power source voltage. At this time, memory access is prohibited. Further, flow of current from the main frame into the power source line is prevented.

9 Claims, 8 Drawing Figures

CASSETTE TYPE SEMICONDUCTOR MEMORY DEVICE

BACKGROUND OF THE INVENTION

The present invention relates to a cassette type semiconductor memory device to be coupled to the main frame of a data processor through a connector.

In recent years, semiconductor memory devices of the cassette type have frequently been used as external memory devices or auxiliary memory devices for extending the capacity of the main memory in small data processors, such as personal computers. This type of memory device is provided with a semiconductor memory device, such as a ROM or a RAM, which device is contained in a cassette. The memory device is called a ROM pack or a RAM pack (and, generally, a memory pack), according to the type of semiconductor memory device used. The memory pack is removably attached to the main frame through a connector.

The ROM pack is of the nonvolatile type, thus requiring no battery pack-up. On the other hand, the RAM pack is of the volatile type, requiring a battery back-up. Due to this feature, the RAM pack cannot be inserted into or removed from the main frame, while the power source of the main frame is in an ON state. In other words, the so-called live-line (or active-line) insertion/removal of the RAM pack is not allowed. The reason for this is that, if the connector pins of the memory pack are slantly placed with respect to the connector sockets of the main frame, it is not possible to insert or remove the connector pins of the memory pack into or away from the connector sockets of the main frame all at a time. As a result, the data in the memory device is erased or changed by an erroneous memory access with an imperfect connection of the power source or ground.

To cope with this problem, the lengths of the connector pins are made to differ according to the kind of the power source and signals, thereby to forcibly set up the order of the insertion/removal of the pins into and away from the sockets. Another approach to this problem is to sense the insertion/removal of the memory pack by means of a photosensor or the like, and to automatically turn off the power source of the main frame.

The former approach is expensive and impractical. Thus, the latter one is widely used at present. Therefore, the live-line insertion/removal of the memory pack, in a strict sense, has not been executed. In the latter approach, since the power source is forcibly turned off, the flow of job is interrupted.

SUMMARY OF THE INVENTION

Accordingly, an object of the present invention is to provide a cassette type semiconductor memory device to be coupled to the main frame of a data processor, through a connector, in which data stored is not erased or changed, even if the memory device is connected to or disconnected from the main frame while a power source of the main frame is in an ON state.

According to the present invention, a cassette type semiconductor memory device to be coupled to the main frame of a data processor having a main power source, through a connector is provided, which device comprises a volatile semiconductor memory, an auxiliary power source for back-up, monitoring circuit for monitoring the voltage of the main power source supplied from the main frame and for producing a permission signal only when the voltage is a normal value, memory control circuit connected between the connector and the semiconductor memory which sets the semiconductor memory in a stand-by mode when the permission signal is not supplied thereto and removes the stand-by mode in response to the permission signal to set the memory in a read/write mode and power source selecting circuit for connecting either the main or auxiliary power source to the semiconductor memory and the memory control circuit.

DETAILED DESCRIPTION OF THE PREFERRED EMBODIMENT

Figure 1:
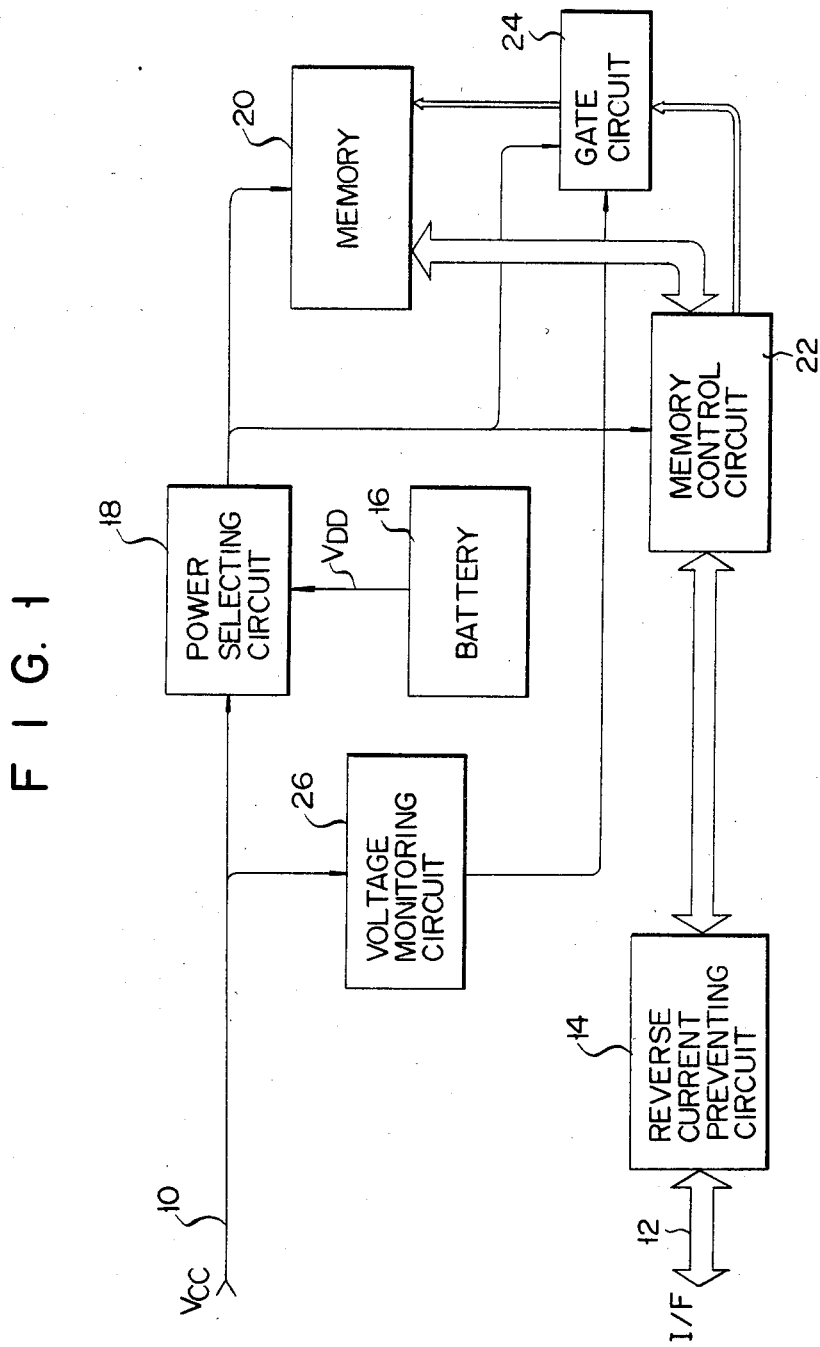
FIG. 1 is a block diagram of an embodiment of a cassette type semiconductor memory device according to the present invention.

An embodiment of a cassette type semiconductor memory device according to the present invention may now be described with reference to the accompanying drawings. The cassette type semiconductor memory device will be outlined with reference to FIG. 1. FIG. 1 is a block diagram of an electrical circuit of the cassette type semiconductor memory device. When the cassette is connected through a connector (not shown) to the main frame of a data processor, the cassette is supplied with a power voltage $V_{CC}$ from a power source of the main frame, via a power line 10. Signals for memory access and data are transmitted to and from the main frame through an interface (I/F) line 12. The interface line 12 is coupled with a reverse current preventing circuit 14. The reverse current preventing circuit 14 blocks a reverse current flowing from the main frame into a power source of the memory pack through the interface line 12.

The memory pack used in this embodiment is a RAM pack backed up by a battery 16 as a back-up power source. The voltages of the battery 16 and power line 10 are supplied to a power selecting circuit 18, which then produces the higher of the two voltages. The voltage $V_{CC}$ of the power source 10 is normally +5 V and the voltage $V_{DD}$ of the battery 16 is +2 to 3 V. With this connection, when the memory pack is connected to the main frame of which power source is in an ON state, voltage $V_{CC}$ is produced, while in the other case, voltage $V_{DD}$ is produced. The output voltage from the power selecting circuit 18 is applied to a memory 20 (a volatile RAM), a memory control circuit 22 and a gate circuit 24. In the present embodiment, an entire memory pack containing the memory and its peripheral circuitry is battery backed-up. It is desirable that the memory 20, the memory control circuit 22 and the gate circuit 24, requiring the battery back-up, are constructed of CMOS circuits which dissipate a less amount of static power, is operable even at a low voltage, e.g., 2 to 3 V, and changes in the threshold level ($\frac{1}{2}$) $V_{DD}$ with a change of the power voltage $V_{DD}$.

The memory control circuit 22, connected to the interface line 12 through the reverse current preventing circuit 14, receives the signal coming through the I/F line, and supplies various control signals for memory access, such as data, address, read/write, chip enable, etc. Of those control signals, a signal for permitting and inhibiting the operation of the memory 20, e.g., a chip enable signal, is supplied to the memory 20, via the gate circuit 24. The gate circuit 24 is controlled by the output signal from a voltage monitoring circuit 26 connected to the power line 10. The voltage monitoring circuit 26 detects the insertion/removal of the memory pack, based on the voltage of the power line 10. At the time of the insertion/removal of the memory pack, gate circuitry is disabled, preventing the data in the memory pack from being erroneously erased or changed. The voltage monitoring circuit 26 applies a permission signal to the gate circuit 24 a fixed time after the insertion of the memory pack is completed, i.e., when the voltage of power line 10 rises to a normal value. Then, the gate circuit 24 is enabled to permit the operation of the memory 20. At the time of the memory pack removal, the voltage monitoring circuit 26 stops the outputting of the permission signal immediately after the voltage of the power line 10 drops, to disable the gate circuit 24 and to prohibit the memory access.

Figure 2:
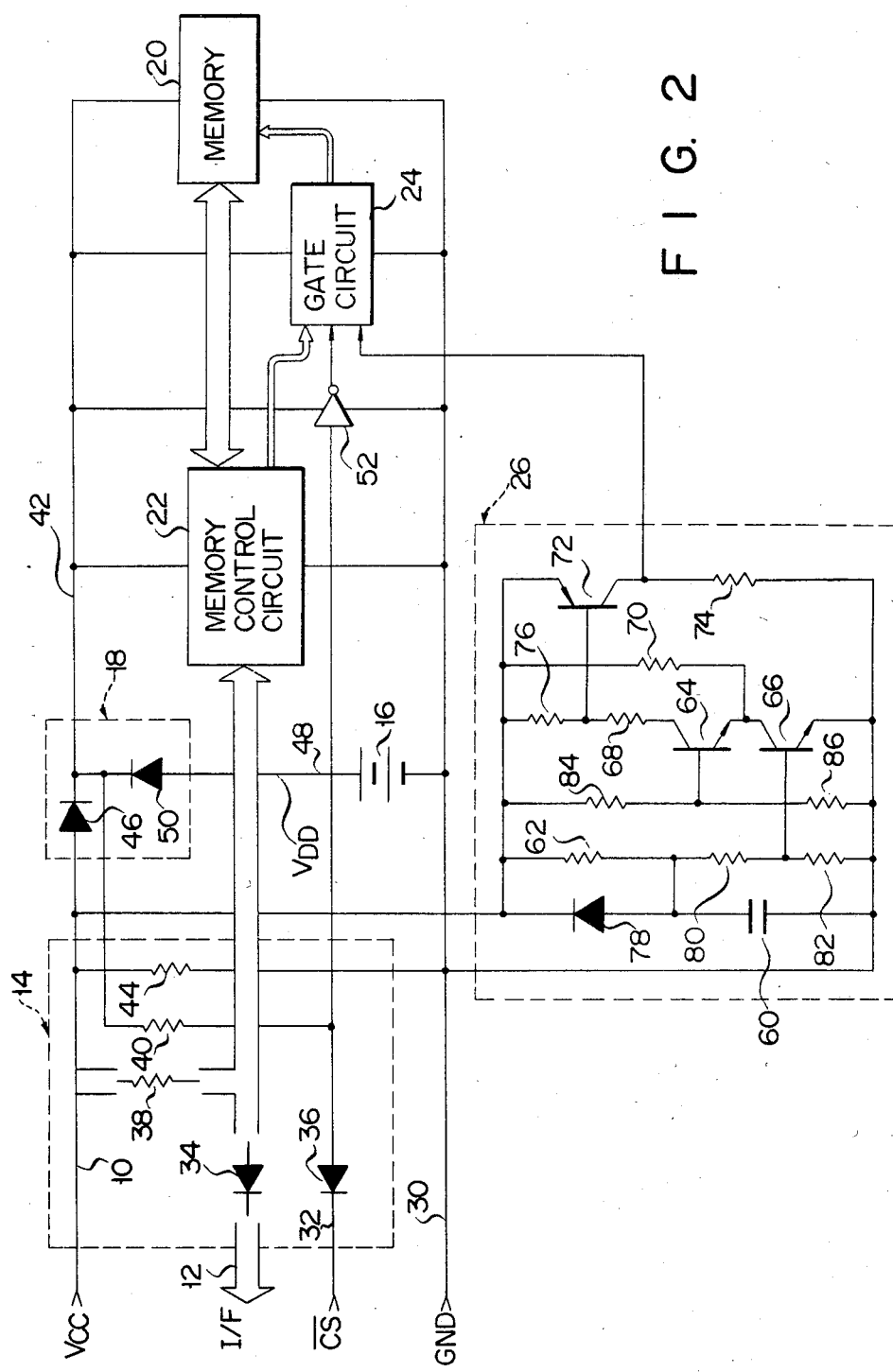
FIG. 2 is a circuit diagram of circuitry including a reverse current preventing circuit, a power selecting circuit, and a voltage monitoring circuit of FIG. 1.

An arrangement of this embodiment may now be described in detail, with reference to FIGS. 2 and 3. FIG. 2 illustrates detailed arrangements of the reverse current preventing circuit 14, the voltage monitoring circuit 26 and the power selecting circuit 18 of the FIG. 1. The gate circuit 24 and the memory 20 of FIG. 2 will be elaborated on FIG. 3. In the figures, like reference symbols are used in designating like or equivalent portions. In FIG. 2, a power system has the power line 10 and a ground line 30. In the signal system, a chip select $\overline{CS}$ line 32 and an interface line 12 for the data, write enable and address signals, etc., are illustrated separately. A chip select signal $\overline{CS}$ is a select signal used for selecting the memory pack, with logic level "0" being applied only in the read/write mode of the memory pack, and logic level "1" (or a floating level) being applied in other modes. The reverse current preventing circuit 14 contains diodes 34 and 36, which are respectively provided in the interface line 12 and chip select $\overline{CS}$ line 32, being directed outwardly, i.e., with the cathodes thereof being connected closer to the main frame. Therefore, in a read/write mode of the memory pack, when the input signal to the memory pack changes from "0" to "1", the diodes 34 and 36 are reversely biased, so that the interface line 12 and the chip select $\overline{CS}$ line 32 are disconnected from the main frame. With this action of the reverse current preventing circuit 14, it is prevented that the voltage of the power line 10 abnormally rises due to the interface signal at the time of the live-line insertion/removal of the memory pack. It is to be noted here that the interface line 12 and the chip select $\overline{CS}$ line 32 are pulled up at the location in the circuit which is closer to the inside of the circuitry than diodes 34 and 36. Therefore, the memory pack is normally operated even when the signal line is cut off by the diodes 34 and 36.

The interface line 12 is connected to the power line 10 on the diodes anode side through a pull-up resistor 38. The chip select $\overline{CS}$ line 32 is connected to the output terminal of the power selecting circuit 18 on the anode side of diode 36 through a pull-up resistor 40. The power line 10 is connected to the ground line 30 through a pull-down resistor 44.

The power selecting circuit 18 is composed of a diode 46 inserted into the power ($V_{CC}$) line 10 and a diode 50 inserted into the output ($V_{DD}$) line 48 of the battery 16. The cathodes of the diodes 46 and 50 are connected together with their connection point connected to an internal power line 42. The internal power line 42 and the ground line 30 are connected to the memory control circuit 22, the gate circuit 24, the memory 20 and an inverter 52. The anode of the diode 36 in the chip select line 32 is connected to the gate circuit 24 via the inverter 52.

The voltage monitoring circuit 26 is comprised of the time constant circuit of a series circuit including a capacitor 60 and a resistor 62, an AND gate circuit including NPN transistors 64 and 66 and resistor 68 and 70, and an inverter containing a PNP transistor 72 and resistors 74 and 76. Reference numeral 78 designates a diode for discharging the charge stored in the capacitor 60. Reference numerals 80, 82, 84, 86 and 88 represent resistors. The collector voltage of the transistor 72 is applied, as an operation permission signal, to the gate circuit 24.

Figure 3:
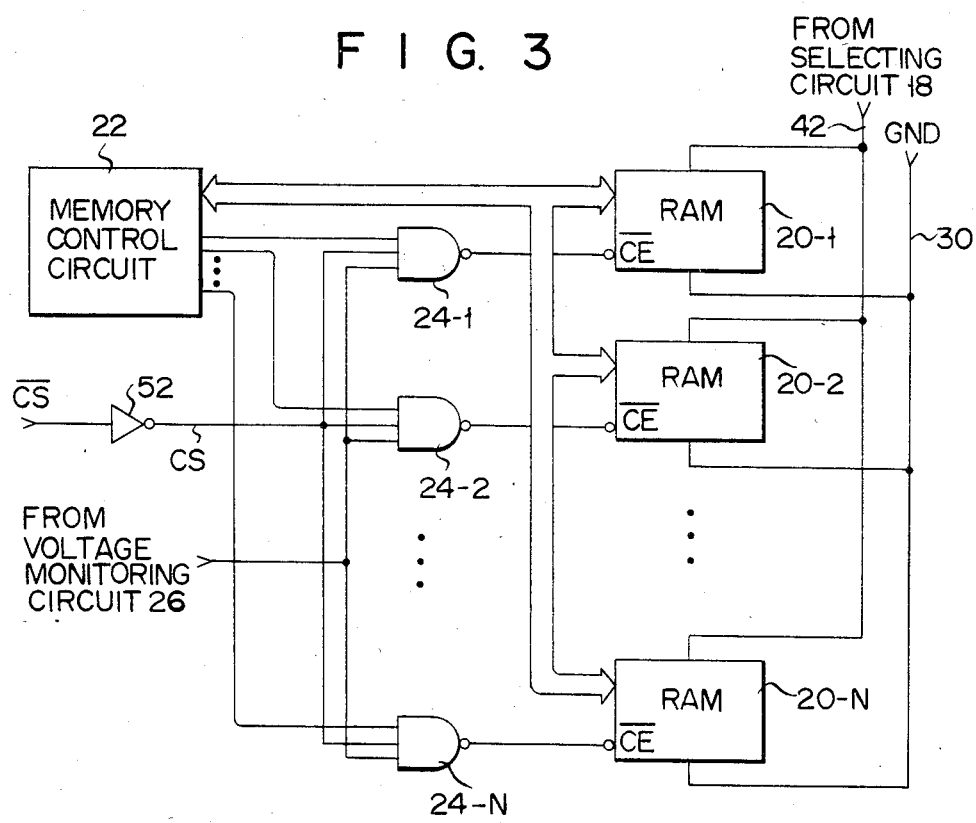
FIG. 3 is a circuit diagram of circuitry including a memory and a gate circuit of FIG. 1.

As shown in FIG. 3, the memory 20 is normally composed of a plurality of RAM chips 20-1, 20-2, ..., 20-N. Correspondingly, the gate circuit 24 contains NAND gates 24-1 to 24-N. The operation permission signal derived from the voltage monitoring circuit 26 is supplied to the first input terminals of the NAND gates 24-1 to 25-N. The chip select signal CS output from the inverter 52 is applied to the second input terminals of the NAND gates 24-1 to 24-N. The third input terminals of the NAND gates 24-1 to 24-N are supplied with an address decoded signal for selecting one of the RAM chips from the memory control circuit 22.

In operation, it is assumed that the memory pack is removed from the main frame. With the 0 V level at which the power line 10 is set by the pull down resistor 44, diode 46 is turned off, while diode 50 is turned on, and the power selecting circuit 18 selects the voltage $V_{DD}$ of the battery 16. This voltage $V_{DD}$ (2 to 3 V) is applied to the memory 20, the memory control circuit 22, the gate circuit 24 and the inverter 52, so that the entire memory pack is battery backed-up. Since the power line 10 is 0 V, the transistors 64, 66, 72 in the voltage monitoring circuit 26 are all turned off, and the operation permission signal derived from the collector of the transistor 72 is at logic level "0". As a result, the output signals from the NAND gates 24-1 to 24-N are at logic level "1" and the RAM chips 20-1 to 20-N are in a stand-by mode, to thereby reliably hold the data. The memory control circuit 22, the gate circuit 24, and the inverter 52 are all in a stand-by mode when those are battery backed-up, to fix the on/off of the circuit elements. For this reason, the leak current is small, giving little power dissipation. If those circuits are constructed of CMOS elements, the circuit output has a low impedance since the CMOS element coupled with either the power source or ground has low impedance. In the conventional memory device requiring the battery back-up, the memory elements and only some peripheral gates are battery backed-up in order to save the power dissipation of the battery. There are many gates which are not disconnected from power source and are in a high impedance state during the battery back-up. Such gates are supplied with a high voltage and may be destroyed when the static electricity is induced. However, according to this embodiment above problem does not occurr since whole the memory pack is in a low impedance state during the battery back-up. As described above, when the memory pack is removed from the main frame, it is backed up by the battery, to ensure the reliable holding of the data therein.

The explanation to follow concerns the operation of the memory pack at the time of the live-line insertion/removal of the memory pack, with reference to FIGS. 4A to 4E, which illustrate timing charts. The high level of each waveform is the $V_{CC}$ level; and the low level, the ground level. As mentioned earlier, at the time of the live-line insertion/removal, the order of the insertion/removal of the lines of the memory pack to and from the main frame is indefinite. Of the signal lines of the main frame, the chip select $\overline{CS}$ line 32 is at a negative (in this case, logical "1") level (signal is absent), while the remaining lines are rarely at an active level (signal is present). This results in imperfect connection of the power source or ground to possibly cause an abnormal phenomenon. For example, the signal having an active level may flow into the power line 10 through the pull-up resistor 38. The voltage of the power line 10 rises by this signal flow so that the data of the memory is erased on changed. In the present embodiment, the reverse current flow from the signal lines 12 and 32 to the power line 10 is blocked by the diodes 34 and 36, thereby to prevent the voltage $V_{CC}$ of the power line 10 from abnormally rising. The diodes 34, 36 are reversely biased when the input signal to the memory pack changes from the "0" level to the "1" level in a normal operation mode (read/write mode), and are hence cut off. The signal level of the signal line after they are cut off is continuously kept at the "1" level by the pull-up resistors 38, 40. Therefore, the memory pack operation is uninfluenced, even when the diodes 34, 36 are cut off.

Figure 4A:
FIGS. 4A to 4E are timing charts illustrating the operation of the cassette type semiconductor memory device of FIG. 1.
Figure 4B:
Figure 4C:
Figure 4D:

When the memory pack is inserted into the main frame in the live-line manner, and the power line 10 and ground line 30 are connected to the main frame, the voltage of the power line 10 rises toward voltage $V_{CC}$ (5 V), as shown in FIG. 4A. With the rise of the power line voltage, the capacitor 60 is charged as shown in FIG. 4B, and the terminal voltage across the capacitor 60 reaches voltage $V_{CC}$, with some delay from that of the power line 10. When the voltage of the power line 10 reaches voltage $V_{CC}$, the transistor 64 is turned on and the emitter voltage of the transistor 64 is $V_{CC}$, as shown in FIG. 4C. After a fixed time delay from the turn on of the transistor 64, the transistor 66 also is turned on. Incidentally, this delay time is determined by the capacitor 60 and the resistors 62, 80 and 82. Upon the turning on of transistor 66, the emitter voltage of transistor 64 (FIG. 4C) is lowered to ground level (0 V). When both transistors 64 and 66 are turned on, transistor 72 is also turned on, and collector voltage of transistor 72, i.e., the operation permissing signal, is rising to the "1" level ($V_{CC}$), as shown in FIG. 4D. The output voltage of the selecting circuit 18 is at the $V_{CC}$ level when the voltage of the power line 10 rises above voltage $V_{DD}$, but equals $V_{DD}$, when the power line 10 voltage is below the $V_{DD}$ level.

The operation permission signal is supplied to the chip enable terminals $\overline{CE}$ of RAM chips 20-1 to 20-N, respectively, through NAND gates 24-1 to 24-N. Therefore, when the operation permission signal is at the "0" level, the RAM chips 20-1 to 20-N are in a stand-by mode. When the operation permission signal is at the "1" level, these chips can be set in a read/write ready mode. In the present embodiment, a situation wherein the operation permission signal is at the "1" level and the read/write for the memory 20 is permitted, is not set up until the predetermined time period after the memory pack is connected to the main frame so that the power connection is set up. Within this predetermined time period, the memory 20 is in a stand-by mode and the data is not changed or erased. The reason why after the power source connection is set up the stand-by mode is continued for the predetermined time period, is that it takes such a time period until the voltage of the power line 10 is stabilized. Any one of the RAM chips 20-1 to 20-N is enabled by the address decoded signal output from the memory control circuit 22, to be in a read/write enable mode.

Figure 4E:
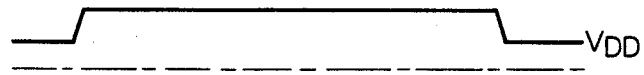

When the memory pack is removed in the live-line state, the chip select $\overline{CS}$ line of the main frame is in a non-select state, i.e., at the "1" level. When the memory pack is removed, the lines are in an open state, but are kept at the "1" level by the pull-up resistor 40. When the voltage of the power line 10 drops from $V_{CC}$ to ground level, as shown in FIG. 4A, the base potential of transistor 64 drops with the drop of the power line voltage. Then, transistor 64 is turned off, as is transistor 72. As a result, the operation permission signal is also at the "0" level, as shown in FIG. 4D. When the memory pack is removed in a live-line state, the memory access is inhibited immediately after the power line 10 is disconnected from the main frame. When the voltage of the power line 10 drops below the voltage $V_{DD}$ of the battery 16, the selecting circuit 18 selects the battery 16 to produce the voltage $V_{DD}$ as shown in FIG. 4E. Therefore, at the time of the live-line removal of the memory pack, when the power line 10 voltage drops, the cassette is immediately backed up by the battery 16 and is set in a stand-by mode, ensuring the reliable holding of data. The charges in the capacitor are immediately discharged to the power line 10, through the diode 78, in preparation for the re-insertion of the memory pack (FIG. 4B). In the voltage monitoring circuit 26, the transistor making up the inverter is of a PNP type, while the transistors for the AND gate are of an NPN type, as already mentioned. The reason different types of transistors are used, is to protect against a hazard which could arise in the operation permission signal at the time of the rise in the voltage of the power line 10, when the live-line insertion is effected.

Of course, this embodiment is applicable to the normal insertion/removal of the memory pack, in which the memory pack is inserted or removed under conditions wherein the power source of the main frame is in an OFF state. When the power source is turned off with the memory pack being connected to the main frame, the same state as that in the live-line removal of the memory pack is set up, and the memory is in a stand-by mode. While the memory pack is in a stand-by mode, the data is not erased or changed when the memory pack is removed.

As described above, a cassette type semiconductor memory device is provided in which, without the provision of any special protecting circuit or a specially structured connector within the main frame, the insertion/removal of the memory pack is detected by monitoring the power voltage supplied from the main frame, and memory access is prohibited in response to such detection, wherby the data is securely protected from being erased or changed, even at the time of the live-line insertion/removal of the memory pack. The periphery circuit of the memory itself, in addition to the memory, is backed up, by a battery thereby preventing an erroneous operation upon the live-line insertion/removal of the memory pack. The low impedance state maintained in the device improves the electrostatic withstanding and noise withstanding performance. The insertion of the diodes directed outwardly in the signal lines prevents a deleterious situation wherein, at the time of the live-line insertion/removal, an abnormal current flows into the power line and the power source voltage rises abnormally.

It should be understood that the present invention may be variously changed and modified within the scope of the present invention.

What is claimed is:

1. A cassette type semiconductor memory device to be coupled to the main frame of a data processor having a main power source, through a connector, comprising:
   a volatile semiconductor memory;
   an auxiliary power source for back-up;
   voltage monitoring means for monitoring the voltage of said main power source supplied from said main frame, and producing a permission signal only when said main power source voltage is a normal value;
   memory control means connected between the connector and said semiconductor memory, which sets said semiconductor memory in a stand-by mode when the permission signal is not supplied thereto, and removes the stand-by mode in response to the permission signal to set the memory in a read/write mode; and
   power selecting means for connecting either of said main or auxiliary power source to said semiconductor memory and said memory control means.

2. A cassette type semiconductor memory device according to claim 1, in which said voltage monitoring means produces a permission signal, a predetermined time from the rise of the voltage of said main power source to the normal voltage value until the voltage of said main power source voltage is below the normal voltage.

3. A cassette type semiconductor memory device according to claim 2, in which said memory control means includes a gate connected to a chip enable terminal of said semiconductor memory, said gate is disabled to inhibit the chip enable of said memoy when said permission signal is not generated.

4. A cassette type semiconductor memory device according to claim 3, in which said memory control means includes means for decoding an address signal, and said gate is enabled by the address decoded signal and said permission signal, to allow the chip enable of said memory.

5. A cassette type semiconductor memory device according to claim 1, in which said power selecting means connects the higher of the two voltages of said main and auxiliary power sources to said memory and said memory control means.

6. A cassette type semiconductor memory device according to claim 1, which further comprising reverse current preventing means connected to a connection line of the main power source for preventing the current flowing into the connection line at a transient time that said cassette type semiconductor memory device is connected to said main frame.

7. A cassette type semiconductor memory device according to claim 6, in which said reverse current preventing means includes diodes inserted into an interface signal line connected to the main frame, with the cathode being directed toward the main frame.

8. A cassette type semiconductor memory device according to claim 7, in which said reverse current preventing means includes pull-up means connected between said interface signal line and said power line.

9. A cassette type semiconductor memory device according to claim 1, in which said memory and memory control means are set in a low impedance state when the auxiliary power source is connected thereto.

* * * * *